Aug. 28, 1962 R. W. HELDA ET AL 3,051,474

CLAMPING DEVICE

Filed Nov. 28, 1958 2 Sheets-Sheet 1

INVENTORS
Robert W. Helda
William L. Lehner
BY
Robert C. Strauser
ATTORNEY

INVENTORS
Robert W. Helda
William L. Lehner
BY
Robert C. Strausser
ATTORNEY

United States Patent Office 3,051,474

Patented Aug. 28, 1962

3,051,474

CLAMPING DEVICE

Robert W. Helda, Williamsville, and William L. Lehner, Snyder, N.Y., assignors, by mesne assignments, to Sylvania Electric Products Inc., Wilmington, Del., a corporation of Delaware Filed Nov. 28, 1958, Ser. No. 776,949

2 Claims. (Cl. 269—165)

This invention generally relates to clamping devices and more particularly to devices which are adapted to provide positioning and holding of electrical chassis of the printed circuit board type.

In the manufacture of printed circuit board electrical chassis, the electrical components are generally placed upon the board in sequence at a plurality of mounting positions which are serially arrayed along a production line. When several lines are used, the boards must be transferred from one to the other. Also, when one line is not functioning, it is advantageous to keep the other lines operating. This necessitates storage of extra chassis at the end of each line and it also necessitates transportation of the extra chassis to and from the storage area from and to the lines. Generally, this transfer operation is performed manually and is thereby expensive and time consuming. In addition, the electrical components and the board are fragile and therefore are extremely difficult to handle and store.

Accordingly, an object of the invention is to reduce the aforementioned disadvantages and to enable the holding, transferring and storing of printed circuit board chassis in a manner which will not injure the boards or electrical components.

A further object is to facilitate improved clamping and releasing of articles by the edge portion thereof so that they may be automatically handled.

The foregoing objects are achieved in one aspect of the invention by the provision of a clamping device having a block formed with a clamping surface and a clamping plate mounted upon the block for restricted movement relative to the surface. A bar is attached to the block and is formed to operate on the plate to provide movement thereof to the clamping position. This clamping device is fabricated so that printed circuit boards can be automatically positioned between the clamping members and the board can be automatically clamped and released without disturbing the electrical components.

For a better understanding of the invention, reference is made to the following description taken in conjunction with the accompanying drawings in which.

Figures 1, 2:
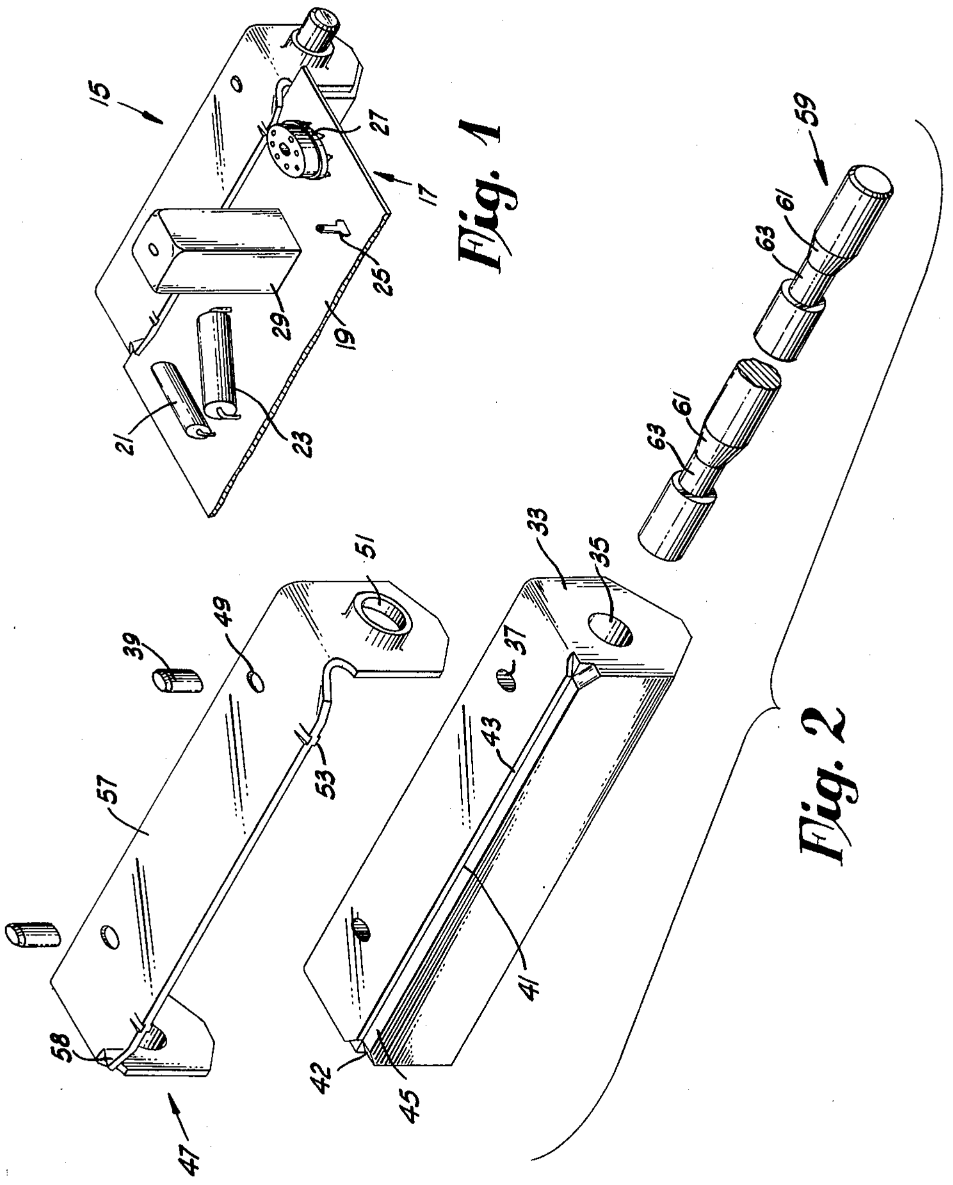
FIG. 1 is a perspective view of part of a printed circuit board chassis which is held in position by means of the clamping device.
FIG. 2 is an exploded perspective view of the clamping device.

Referring to FIG. 1, the clamping device 15 is shown supporting a printed circuit board electrical chassis 17 by the edge portion thereof. This chassis may be of the type normally used in radio or television apparatus and may comprise, for instance, an insulating base 19 having mounted thereon a capacitor 21, resistor 23, connector 25, tube base 27 and an I.F. can 29.

Figure 5:
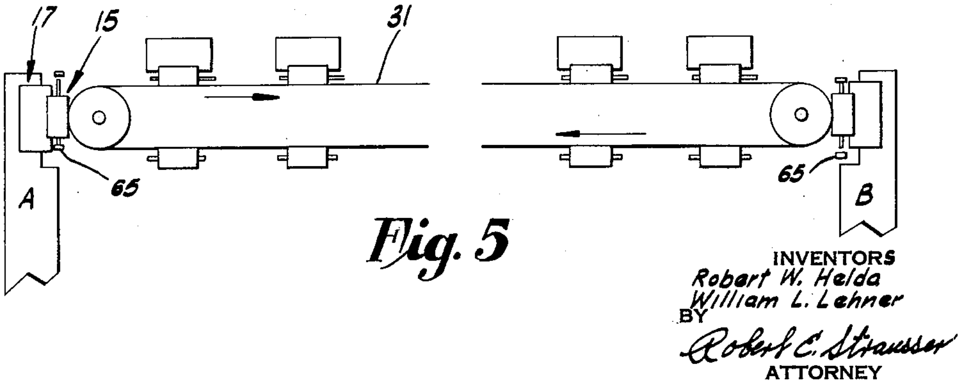
FIG. 5 illustrates a conveyor system adapted to utilize the clamping device for purposes of transferring printed circuit boards from one position to another.

Clamping device 15 can be used to hold board 17 while it has an operation performed thereon or it may be used in conjunction with a transfer mechanism or driven chain conveyor 31 of the type illustrated in FIG. 5. For instance, as boards 17 move to the end of production line A, they may be automatically picked up in sequence by the clamping device 15 attached to conveyor 31 and they may be then transported to and released at production line B. If desired, conveyor 31 may serve as a "surge" line to store boards from line A when line B is not operating and to deposit them at line B when line A is not operating.

Figure 3:
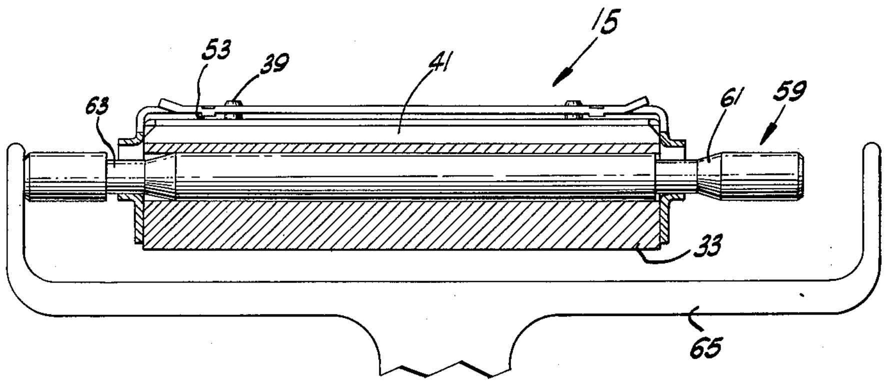
FIGS. 3 and 4 are sectional views illustrating the manner in which the clamping bar affects the clamping movement.
Figure 4:
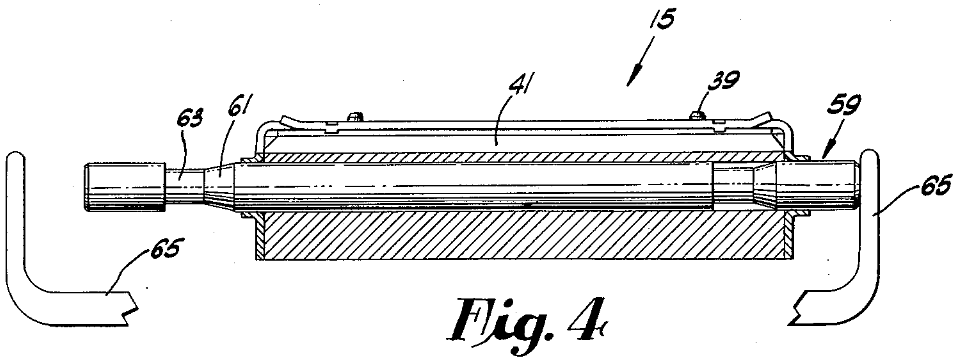

Referring to FIGS. 2, 3 and 4, clamping device 15 comprises a substantially rectangular block 33 formed to provide a longitudinal cylindrical opening 35. The upper surface of the block has spaced apertures 37 formed therein for holding pins 39. Near the forward upper surface of block 33 is a shoulder 41 formed with a back surface 43 and a clamping surface 45. The edge of the printed circuit board 17, when in position, rests upon clamping surface 45 and is aligned relative to clamping device 15 by means of back surface 43. The ends 42 of shoulder 41 are chamfered to provide easy access to the shoulder when the printed circuit board 17 is moved edgewise into the position where it will contact shoulder 41.

A substantially U-shaped spring bracket 47 is formed to longitudinally straddle block 33 and to be held upon the block by means of pins 39, which extend through apertures 49. When in position, the legs of bracket 47, which have sleeves 51 formed therein, are disposed adjacent the ends of cylindrical opening 35. Spaced clamping faces or protrusions 53 are provided in plate 57 of the bracket. The apertures 49 in bracket 47 are slightly larger than the diameters of pins 39 so that the bracket can be moved in a restricted manner. This loose fit allows clamping of board 17 by allowing movement of protrusions 53 toward clamping surface 45. The forward edges of the upper plates 57 are provided with wings 58 to guide the board and to allow access to the clamping device without interference.

A clamping bar 59 is slidably mounted within cylindrical opening 35. The bar is formed to provide inclined portions 61 interconnecting the outer periphery of the bar with recesses 63. The inclined portions and recesses, which are disposed at both ends of the bar, are positioned so that movement of the bar in a given direction will cause the inclined portions to operate on sleeves 51 in a given manner to provide clamping as will be hereafter described.

Referring to FIG. 3, clamping device 15 is shown in a board release position with bar 59 extending through cylindrical opening 35 and sleeves 51 so that recesses 63 are disposed adjacent the internal surface of the sleeves. At this position, clamping faces 53 are spaced from clamping surface 45 a distance approximately equal to or greater than the thickness of printed circuit board 17. After a board has been slid into position so that the edge of the board lies between clamping faces 53 and clamping surface 45, bar 59 is moved to the left, FIG. 4, so that inclined portions 61 operate upon the internal surface of sleeves 51. This forces bracket 47 to move clamping faces 53 toward clamping surface 45. Final clamping is achieved when the outer peripheral surface of bar 59 is disposed within sleeves 51. Although plate 57 moves through a restricted distance. it is sufficient to allow the printed circuit board 17 to be inserted between the clamping members and to be released when bar 59 is again moved to the position shown in FIG. 3. Due to the spring action of the bracket, only a relatively small force, e.g. 40 pounds, is needed for application to the end of bar 59 to achieve clamping.

In practice, plate 57 may be lying upon the upper surface of block 33 when bar 59 is in the release position or it may be held in a spaced position slightly above the upper surface by virtue of friction between the adjoining sides of the block and bracket 47 as shown in FIG. 3. Under any circumstance, when the edge of board 17 is slid along shoulder 41, plate 57 will yield, if need be, to receive the board. As mentioned above, the bracket is loosely held on pins 39 by virtue of the oversized apertures 49. When bar 59 is moved to the position shown in FIG. 4, the board 17 is clamped tightly between faces 53 and surface 45. Upon release or movement of the bar back to the position of FIG. 3, the plate 57 springs back to allow removal of the board.

If desired, a device such as yoke 65 may be employed in conjunction with conveyor 31 so that the movement of bar 59 can be automatically controlled. This yoke may be mounted near stations A and B for operation in accordance with the position of devices 15 to provide clamping or releasing of the appropriately positioned board.

Clamping device 15 may be mounted upon conveyor 31 in any conventional manner such as by bolts or brackets connected to the links or chains of the conveyor.

Clamping devices formed in accordance with the invention are capable of receiving, clamping and releasing printed circuit board without injury to either the board or to the fragile components mounted thereon. Also, the clamping device is uniquely adapted for use with automatic production techniques and can handle boards of different thicknesses, e.g. .060 inch to .125 inch, without modification.

Although one embodiment of the invention has been shown and described herein, it will be apparent to those skilled in the art that various changes and modifications may be made therein without departing from the scope of the invention as defined by the appended claims.

What is claimed is:

1. A clamping device for an article provided with an edge portion comprising a block formed with a longitudinal cylindrical opening and a shoulder formed at the exterior surface of said block to receive said edge portion of the article comprising a clamping surface and a back surface formed to abut said article edge portion lying substantially perpendicular to said clamping surface, a clamping bracket formed to provide clamping faces spaced from and aligned with said shoulder clamping surface and sleeves located adjacent the ends of said longitudinal opening, said clamping bracket, clamping surface, and back surface being positioned relative to one another to provide an open front and open ended longitudinally extending slot for receiving said article edge portion, said clamping bracket being mounted on the block for restricted transverse movement between an article release position and an article clamping position whereat said article edge portion is held between said clamping faces and the clamping surface of said shoulder, and a clamping bar mounted in said cylindrical opening for longitudinal movement and extending through said sleeves formed to operate transversely on said sleeves to provide transverse movement of the bracket clamping faces relative to said block clamping surface.

2. A clamping device for an article provided with an edge portion comprising a block formed with a longitudinal cylindrical opening and a shoulder formed at the exterior surface of said block to receive said edge portion of the article comprising a clamping surface and a back surface formed to abut said edge portion lying substantially perpendicular to said clamping surface, a substantially U-shaped clamping bracket having a center plate interconnecting the legs thereof, said bracket being formed to provide clamping faces on the center plate spaced from and aligned with said shoulder clamping surface and oppositely disposed sleeves formed in the legs located adjacent the ends of said longitudinal opening, said clamping bracket, clamping surface, and back surface being positioned relative to one another to provide an open front and open ended longitudinally extending slot for receiving said article edge portion, said clamping bracket being mounted on the block for restricted transverse movement between an article release position and an article clamping position whereat said article edge portion is held between said clamping faces and the clamping surface of said shoulder, and a clamping bar mounted in said cylindrical opening for longitudinal movement and extending through said oppositely disposed sleeves, said bar having inclined portions formed to operate transversely on said sleeves during longitudinal bar movement to provide transverse movement of the bracket relative to said block thereby providing relative transverse movement of the clamping faces relative to the clamping surface.

References Cited in the file of this patent

UNITED STATES PATENTS

| | | |
|---|---|---|
| 1,154,916 | Evans | Sept. 28, 1915 |
| 2,305,143 | Curtis | Dec. 15, 1942 |
| 2,643,848 | Hoffmann | June 30, 1953 |